United States Patent [19]

Hamuro et al.

[11] Patent Number: 5,540,535
[45] Date of Patent: Jul. 30, 1996

[54] APPARATUS FOR PUSHING CHIP COMPONENTS INTO HOLDING PLATE

[75] Inventors: Mitsuro Hamuro; Hirokazu Higuchi; Akihiko Takahashi, all of Nagaokakyo, Japan

[73] Assignee: Murata Manufacturing Co., Ltd., Japan

[21] Appl. No.: 178,027

[22] Filed: Jan. 6, 1994

[51] Int. Cl.$^6$ .............................. B65G 65/00; H05K 3/30
[52] U.S. Cl. ........................... 414/417; 414/404; 29/740; 29/759
[58] Field of Search ........................... 414/417, 416, 414/404; 29/739, 759, 740, 760, 559, 450, 741, 235

[56] References Cited

U.S. PATENT DOCUMENTS

| | | | |
|---|---|---|---|
| 4,102,043 | 7/1978 | Andrade et al. | 29/739 |
| 4,381,321 | 4/1983 | Braden | 427/79 |
| 4,393,808 | 7/1983 | Braden | 414/417 X |
| 4,395,184 | 7/1983 | Braden | 414/417 |
| 4,526,129 | 7/1985 | Braden | 269/900 X |
| 4,553,322 | 11/1985 | Cappos et al. | 29/739 |
| 4,584,764 | 4/1986 | Gussman | 29/705 |
| 4,664,943 | 5/1987 | Nitta et al. | 427/58 |
| 4,669,416 | 6/1987 | Delgado et al. | 118/503 |
| 4,847,991 | 7/1989 | Higuchi | 29/759 |
| 5,167,326 | 12/1992 | Murphy | 206/331 |
| 5,249,906 | 10/1993 | Nakagawa et al. | 414/417 |

FOREIGN PATENT DOCUMENTS

| | | |
|---|---|---|
| 2151159 | 7/1985 | United Kingdom . |
| 2152854 | 8/1985 | United Kingdom . |
| 2169923 | 7/1986 | United Kingdom . |
| 2212818 | 8/1989 | United Kingdom . |

*Primary Examiner*—Karen B. Merritt
*Assistant Examiner*—Stephen Gordon
*Attorney, Agent, or Firm*—Ostrolenk, Faber, Gerb & Soffen, LLP

[57] ABSTRACT

A vertically movable support member is mounted on a table, and a guide plate and a holding plate are placed on this support member. The plates are accurately located by side stoppers and setting mechanisms for pushing those plates toward the side stoppers. Releasing cylinders operate to open the setting mechanisms when the plates are placed on and taken out from the support member. A backing plate which is arranged above the support member is downwardly moved to integrally press down the holding plate, the guide plate and the support member, so that a number of upright press pins arranged therebelow upwardly push chip components from the guide plate into the holding plate. Since the holding plate is prevented from deformation by the backing plate, dispersion in inserting depths of the chip components is reduced.

21 Claims, 8 Drawing Sheets

5,540,535

APPARATUS FOR PUSHING CHIP COMPONENTS INTO HOLDING PLATE

BACKGROUND OF THE INVENTION

The present invention relates to an apparatus for pushing chip components such as chip capacitors or chip resistors from a guide plate into a holding plate, or from a holding plate into another holding plate.

U.S. Pat. No. 4,395,184 discloses a method of forming electrodes on both ends of chip components. According to this method, it is possible to simultaneously coat electrode material on ends of a number of these components by using a holding plate which comprises a number of through holes surrounded by elastic material. In this method, however, since components are charged into guide holes of a guide plate superposed on the holding plate, the holding plate is easily stained by flakes of the components, dust and the like falling thereon. Moreover, since components are downwardly pushed by pins from the guide plate into the holding plate, the components are upwardly projected from the through holes of the holding plate. Therefore, an extra step may be required for inverting the holding plate in advance of the electrode coating step.

In order to solve such problems, a guide plate disclosed in U.S. Pat. No. 4,847,991 comprises a number of through holes each of which has a large-diameter portion and a small-diameter portion. In this case, a holding plate is superposed on the guide plate and components are upwardly pushed by pins from the guide plate into the holding plate, so that the components are held with one end thereof downwardly projected from the through holes of the holding plate.

However, the holding plate is generally provided with thousands of through holes. Therefore, when components are simultaneously inserted into such through holes by pins, a large force acts on the holding plate so as to deflect a central portion thereof. Thus, when the components are inserted in such a deflected holding plate, the insertion depths of the respective components are dispersed. Further, a large load is imposed on the holding plate, to reduce its durability.

SUMMARY OF THE INVENTION

An object of the present invention is to provide an apparatus for pushing chip components which can reduce a load on a holding plate when pressed and which can reduce dispersion in insertion depths of chip components.

Another object of the present invention is to provide an apparatus for pushing chip components which can facilitate setting and discharging of a holding plate, and which can insert chip components into the holding plate efficiently.

The apparatus according to the present invention can be adapted to transfer chip components from a guide plate into a holding plate. The holding plate has a number of through holes for resiliently holding the components, and the guide plate has a number of guide holes corresponding to the through holes for receiving the components. The apparatus comprises a pin head for upwardly pushing the components from the guide holes into the through holes, a support member for supporting the guide plate and the holding plate superposed thereon, location means for locating the guide plate and the holding plate at a constant position on the support member, a backing plate for pressing an upper surface of the holding plate, and drive means for vertically driving the backing plate or the pin head. The pin head has a number of uprightly directed press pins corresponding to the through holes of the holding plate. The support member is horizontally arranged above the pin head and is vertically movable. The backing plate is arranged above the support member and has a horizontal pressing surface.

Each of the guide holes may preferably have a large diameter portion opening at an upper surface of the guide plate and a small diameter portion extending from a bottom of the large diameter portion to a lower surface of the guide plate. The large diameter portion has a cross-sectional size sufficiently large to receive one of the components, and the small diameter portion has a cross-sectional size which is smaller than that of each of the components and which is large enough to be passed through by one of the press pins.

A method of transferring chip components from the guide plate into the holding plate is now described herebelow. First, the guide plate in which the components are already received in the guide holes is placed on the the support member and the the holding plate without the components is superposed on the guide plate. When the drive means downwardly drives the backing plate, the pressing surface presses the upper surface of the holding plate and then downwardly moves the holding plate together with the guide plate and the support member. Thereafter, the press pins are inserted into the guide holes from below, so that the tops of the press pins push up the lower ends of the components. Then, the upper ends of the components are upwardly pushed into the through holes of the holding plate so as to expose the lower ends thereof below the holding plate. Since the upper surface of the holding plate is supported by the pressing surface of the backing plate in such a pressing operation, the holding plate can be prevented from deflection. Thus, it is possible to reduce dispersion in insertion depths of the components, as well as to reduce a load imposed on the holding plate.

Since the support member moves in accordance with the vertical movement of the backing plate, it is possible to easily insert the components in the through holes by simply vertically driving the backing plate. In order to easily pass the press pins through the support member, the support member may preferably have an opening larger than a holes-distributed range of the holding plate.

Since the backing plate and the pin head are arranged at a press position, it is preferable to set the guide plate and the holding plate on the support member at a position different from the press position. Therefore, the support member is preferably mounted on a table which can be horizontally moved between a set position and the press position. In this case, it is possible to set the guide plate and the holding plate on the support member at the set position having a sufficient space for setting operation, whereby setting and discharging of the holding plate and the guide plate can be carried out efficiently. Further, it is possible to shorten the distance between the backing plate and the pin head at the press position, whereby the stroke of the backing plate can be reduced.

Moreover, although the guide plate and the holding plate can be discharged at the set position, they may be discharged at a discharge position which is prepared in addition to the set position and the press position.

When the guide plate and the holding plate are placed on the support member, these plates are located at a constant position on the support member by a location means.

The location means may have side stoppers fixed on an upper surface of the support member for stopping perpendicular pairs of side edges of the guide plate and the holding plate, and setting means provided on the support member for pushing these plates against the side stoppers. This setting means may have setting members which keep in touch with the remaining pairs of side edges of these plates, and urging means such as springs which force the setting members to push these plates toward the side stoppers. Since such a location means is provided on the support member, the holding plate and the guide plate placed on the support member are kept on a constant position thereon even when the support member is moved in vertical and horizontal directions.

Moreover, releasing means for removing the pushing force of the setting means may preferably be provided. In this case, the releasing means operate to keep the setting means in open positions which can provide enough space on the support member so that the operations of setting and discharging of the plates are easily performed. Thereafter, the releasing means cancel their force so that the setting means come into closed positions by themselves.

Further, when the support member with the location means is mounted on a horizontally movable table, the releasing means may be provided beside the stopping positions of the table where the plates are set thereon or discharged therefrom. In this case, the releasing means operate to keep the setting means in open positions when the table is stopping to set and discharge the plates. Since the releasing means are not mounted on the movable table or the support member, it is possible to simplify and miniaturize the structures of those movable members.

Further, when stopper means is provided in order to define a lowermost limit position of the vertical movement of the backing plate, it is possible to accurately set the insertion depths of the components.

The apparatus according to the present invention can also be adapted to transfer chip components from a first holding plate into a second holding plate through a spacer.

In this case, the first holding plate has a number of through holes for resiliently holding the components, the second holding plate has a number of through holes corresponding to the through holes of the first holding plate for resiliently holding the components, and the spacer for defining a clearance between the first and second holding plates has an opening larger than holes-distributed ranges of the holding plates.

The first holding plate holding components on upper sides of its through holes is placed on the support member, the spacer is placed thereon, and the second holding plate without components is placed thereon. The spacer is adapted to prevent the components from being simultaneously held by both holding plates, and its thickness is preferably smaller than the length of each component. The upper surface of the second holding plate is pressed by the backing plate so that the press pins are inserted in through holes of the first holding plate to upwardly push the components, whereby the upper portions of the components can be easily inserted into through holes of the second holding plate.

In the present invention, one of the pin head and the backing plate can be relatively vertically moved with respect to the other one, such that the pin head is fixed at a constant position and the backing plate is downwardly moved, or the backing plate is fixed at a constant position and the pin head is upwardly moved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
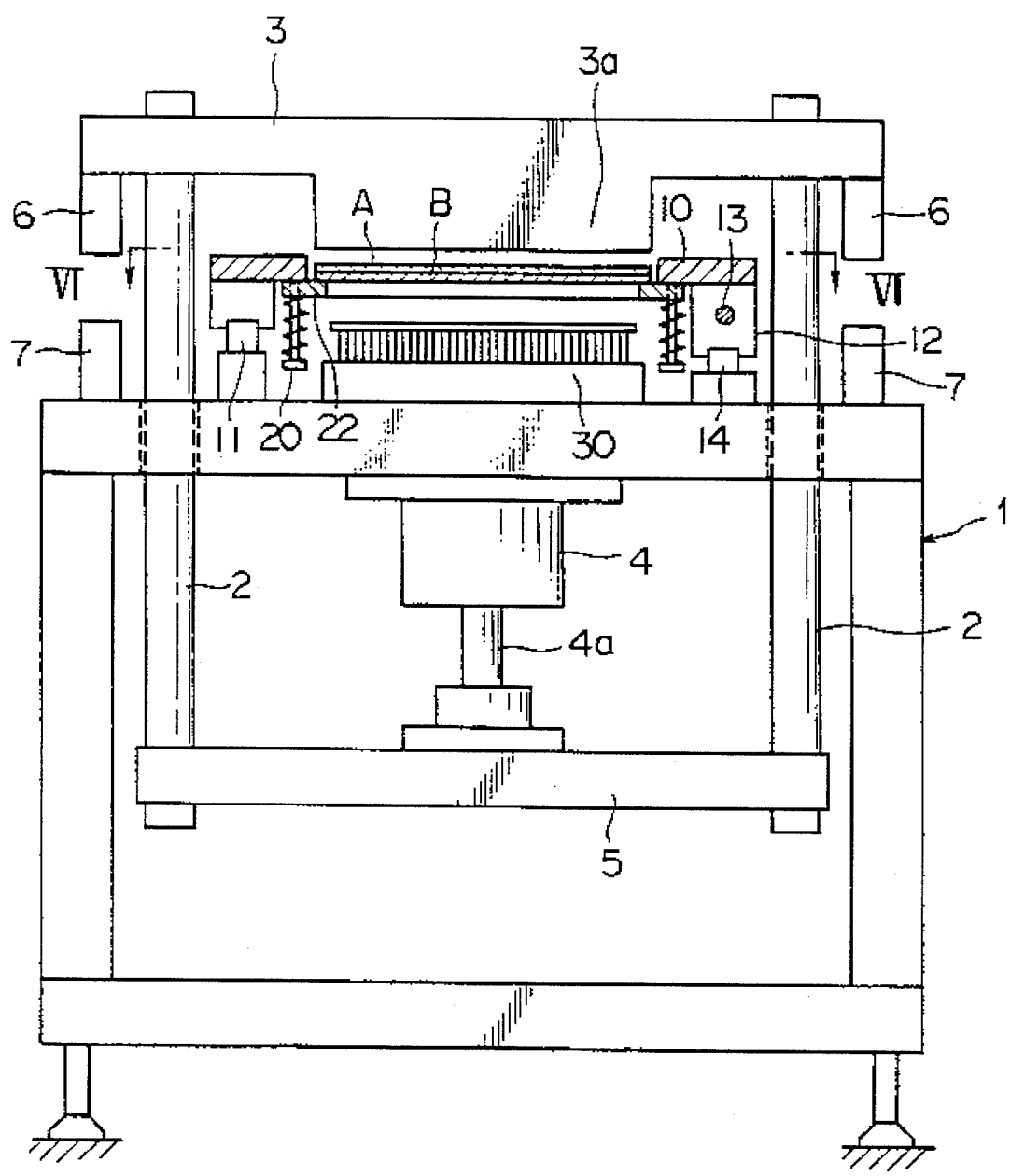
FIG. 1 is a schematic front elevational view showing an apparatus according to an embodiment of the present invention.
Figure 2:
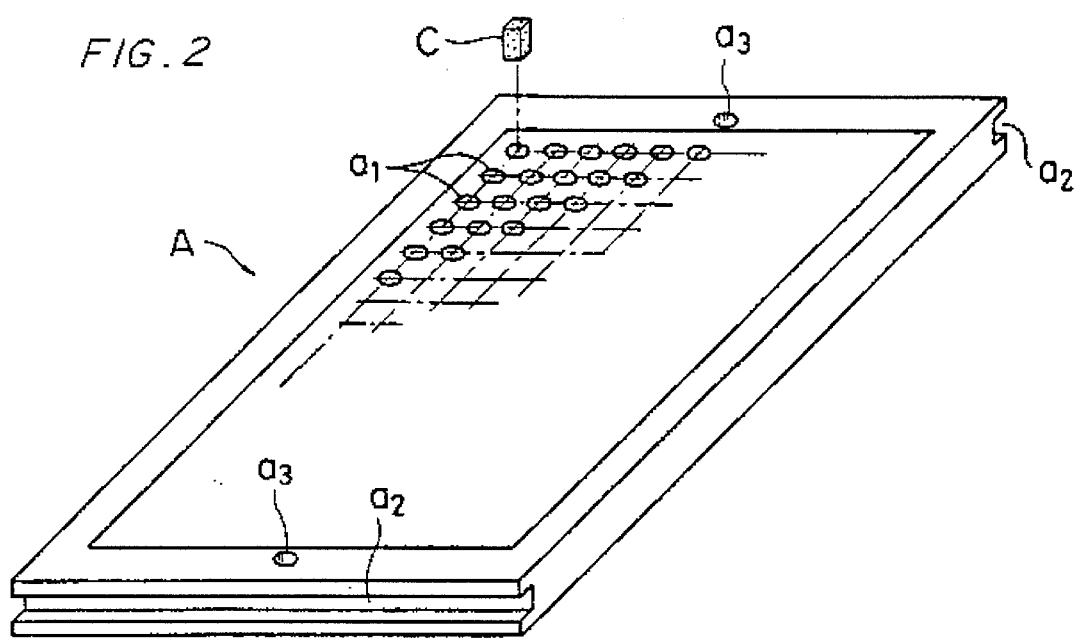
FIG. 2 is a perspective view showing a holding plate.
Figure 3:
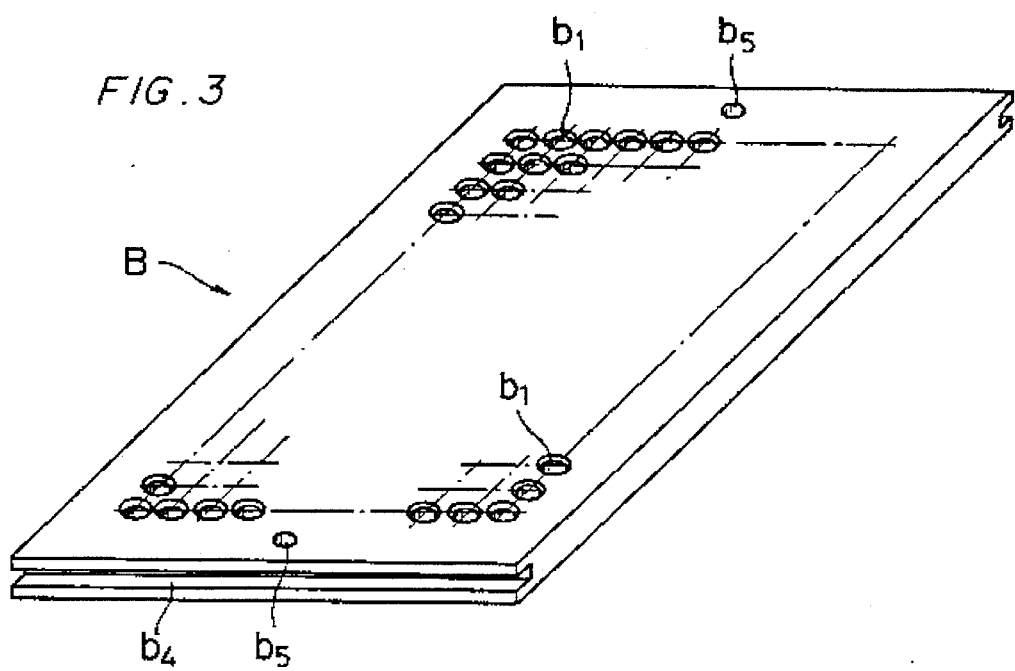
FIG. 3 is a perspective view showing a guide plate.
Figure 4:
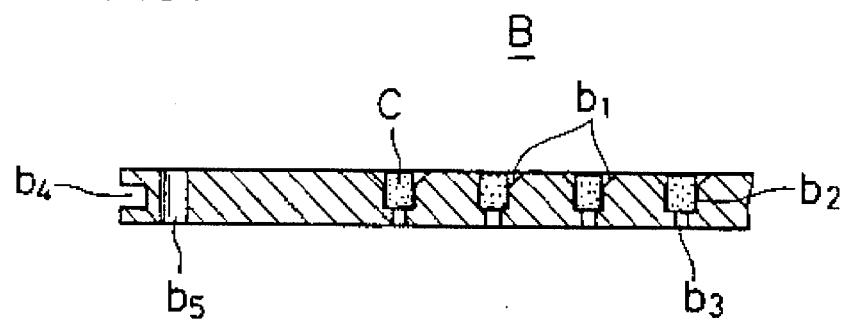
FIG. 4 is a sectional view showing a guide plate receiving chip components.
Figure 5:
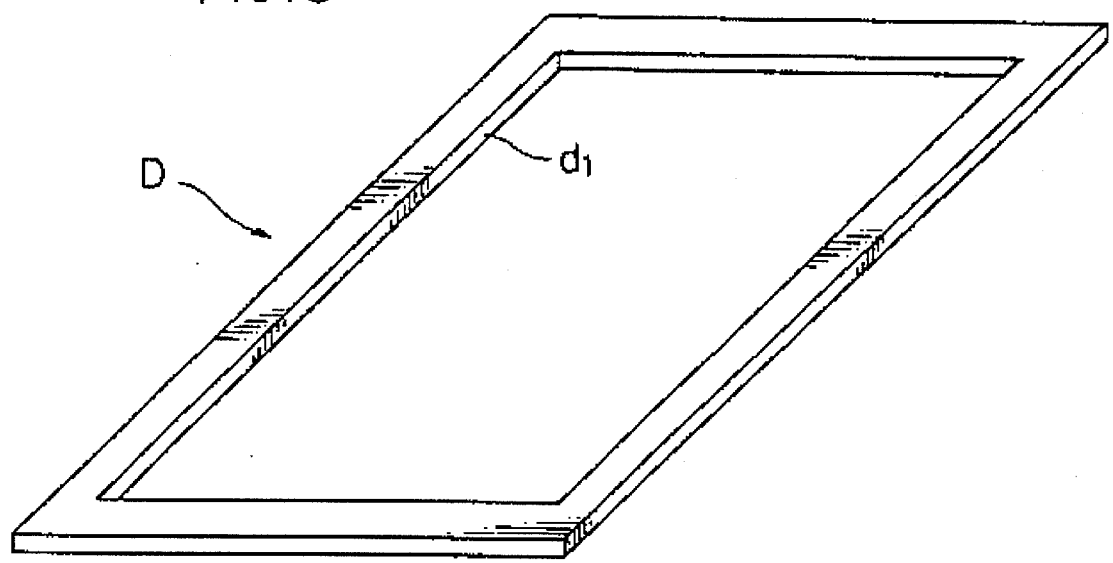
FIG. 5 is a perspective view showing a spacer plate.

FIG. 1 shows a press unit as an embodiment of an apparatus according to the present invention. In this embodiment, a holding plate A, a guide plate B and a spacer plate D are used to transfer the chip components C. The holding plate A shown in FIG. 2 has a number of through holes $a_1$ surrounded by elastic material for resiliently holding components C, grooves $a_2$ formed on shorter side surfaces thereof, and pin holes $a_3$ formed close to the shorter sides thereof. The guide plate B shown in FIG. 3 has guide holes $b_1$ corresponding to the through holes $a_1$. Each of these guide holes $b_1$, as shown in FIG. 4, has a large diameter portion $b_2$ opening at the upper surface of the guide plate B and having a cross-sectional size sufficiently large to receive one of the components C, and a small diameter portion $b_3$ extending from the bottom of the large diameter portion $b_2$ to the lower surface of the guide plate B and having a cross-sectional size smaller than the cross-sectional size of the component C. The upper end of each large diameter portion $b_2$ may preferably be tapered so as to be enlarged. Also, the guide plate B has grooves $b_4$ formed on shorter side surfaces thereof, and pin holes $b_5$ corresponding to the pin holes $a_3$. Further, the spacer plate D shown in FIG. 5 is in the form of a rectangular frame having an opening d, which is larger than a region of the holding plate A where the holes are distributed, and its thickness is shorter than the length of the component C. The outlines of those plates A, B and D are identical to each other, and structures thereof are similar to those described in U.S. Pat. No. 4,847,991.

A unit body 1 is provided with a pair of vertical shafts 2 which are slidably guided by the body 1 in a vertical direction. A backing plate 3 is horizontally fixed on upper ends of the shafts 2. Lower ends of the shafts 2 are connected with a piston rod 4a of a cylinder 4 through a connecting plate 5, so that the backing plate 3 can be vertically moved by driving the cylinder 4. The backing plate 3 is provided on its central lower surface with a horizontal pressing surface 3a, which is substantially identical in shape to a pin head 30 as described later. Stoppers 6 are provided on lower surfaces of both ends of the backing plate 3, so that lower surfaces thereof are brought into contact with upper surfaces of stoppers 7 which are mounted on the upper surface of the unit body 1. Thus, the lowermost limit position of the vertical movement of the backing plate 3 is defined by those stoppers 6 and 7. Since either one or both of the stoppers 6 and 7 are changeable, the distance between the backing plate 3 and the unit body 1 can be varied.

Figure 6:
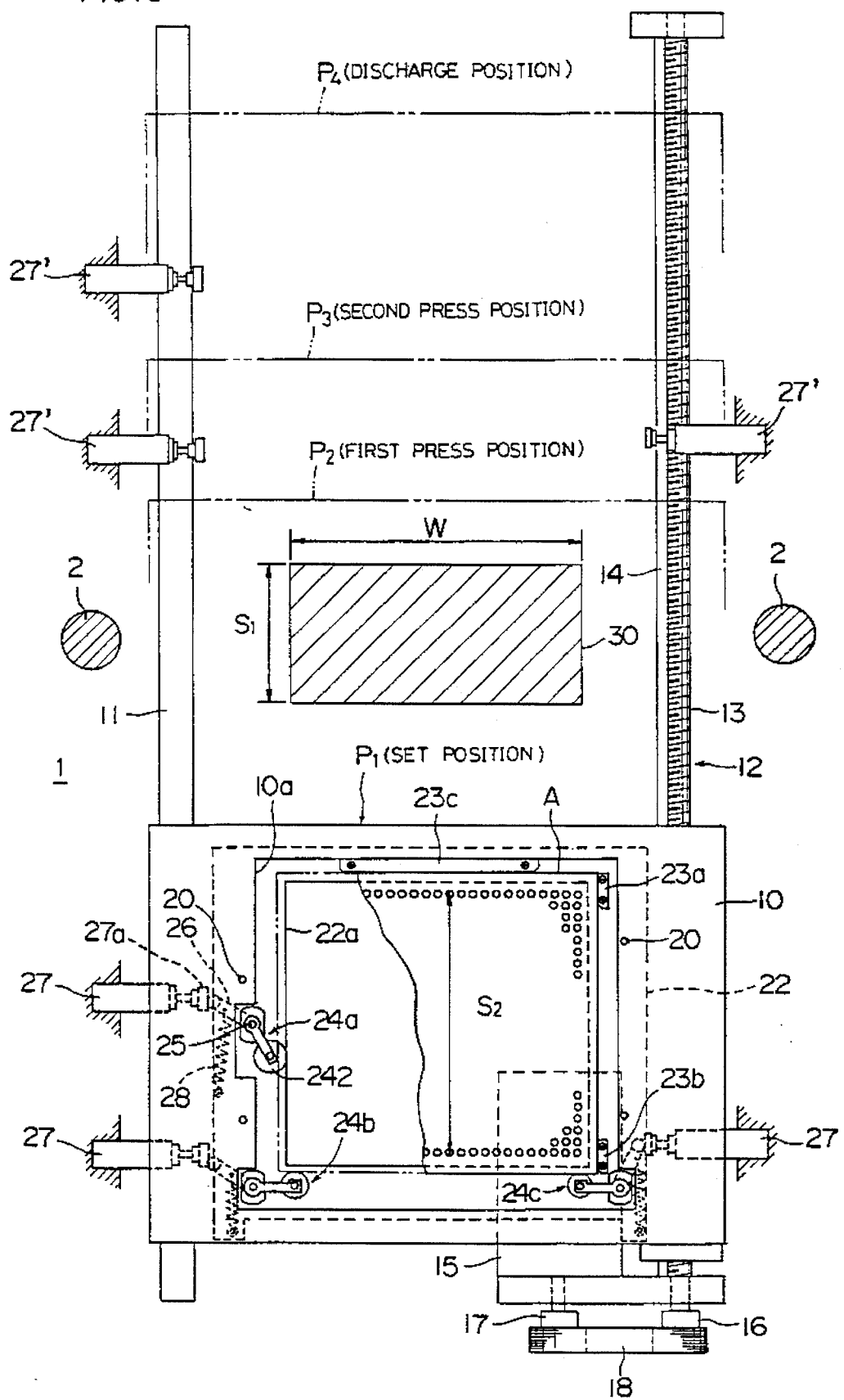
FIG. 6 is a partially fragmented sectional view taken along the line VI—VI in FIG. 1.

As shown in FIG. 6, a frame-type table 10 is slidably supported by a pair of guide rails 11 and 14 on the unit body 1, and is driven in a horizontal direction by a drive assembly 12. The drive assembly 12 comprises a ball screw 13 and a motor 15 such as a pulse motor which drives the ball screw 13 through pulleys 16 and 17 and a drive belt 18. A position where the table 10 is stopped can be freely adjusted by signals which are inputted to the motor 15.

Figure 10A:
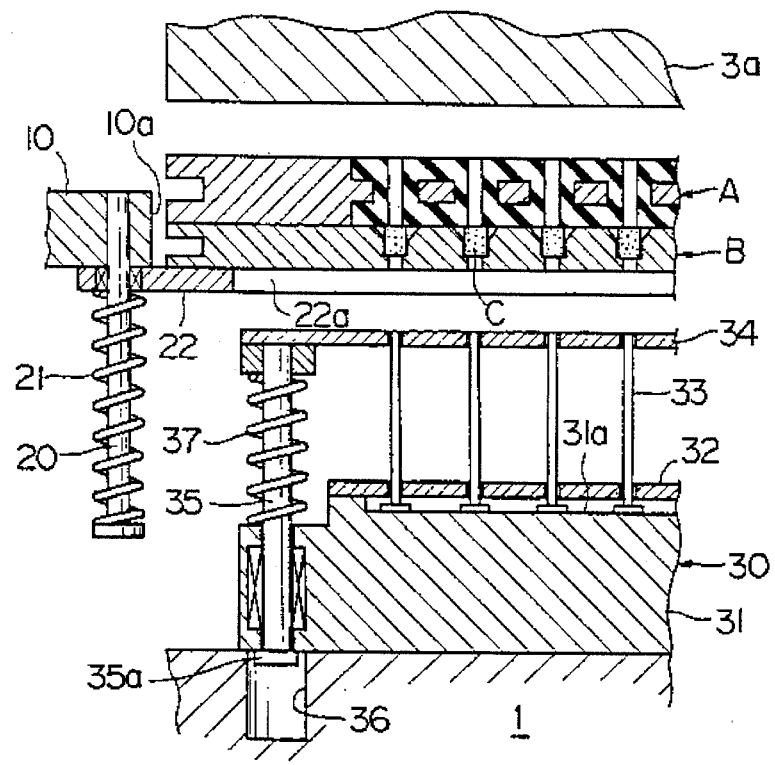
FIG. 10A is a detailed sectional view showing a principal part of the apparatus before chip components are transferred from a guide plate into a holding plate.

The table 10 is provided at its center with an opening 10a which is larger than the holding plate A. Further, a support member 22, which is slidably guided by guide shafts 20, is vertically movable under the table 10 and is upwardly urged by springs 21 toward the lower surface of the table 10 as shown in FIG. 10A. The support member 22 is provided in its center with an opening 22a which is smaller than the outline of the holding plate A and larger than a stripper plate 34 of a pin head 30 as described later. Side stoppers 23a, 23b and 23c for locating perpendicular pairs of side edges of the plates A and B are fixed on the upper surface of the support member 22. The plates A and B are pushed against the side stoppers 23a, 23b and 23c by three setting mechanisms 24a, 24b and 24c to be accurately located at a constant position on the support member 22.

Figure 7:
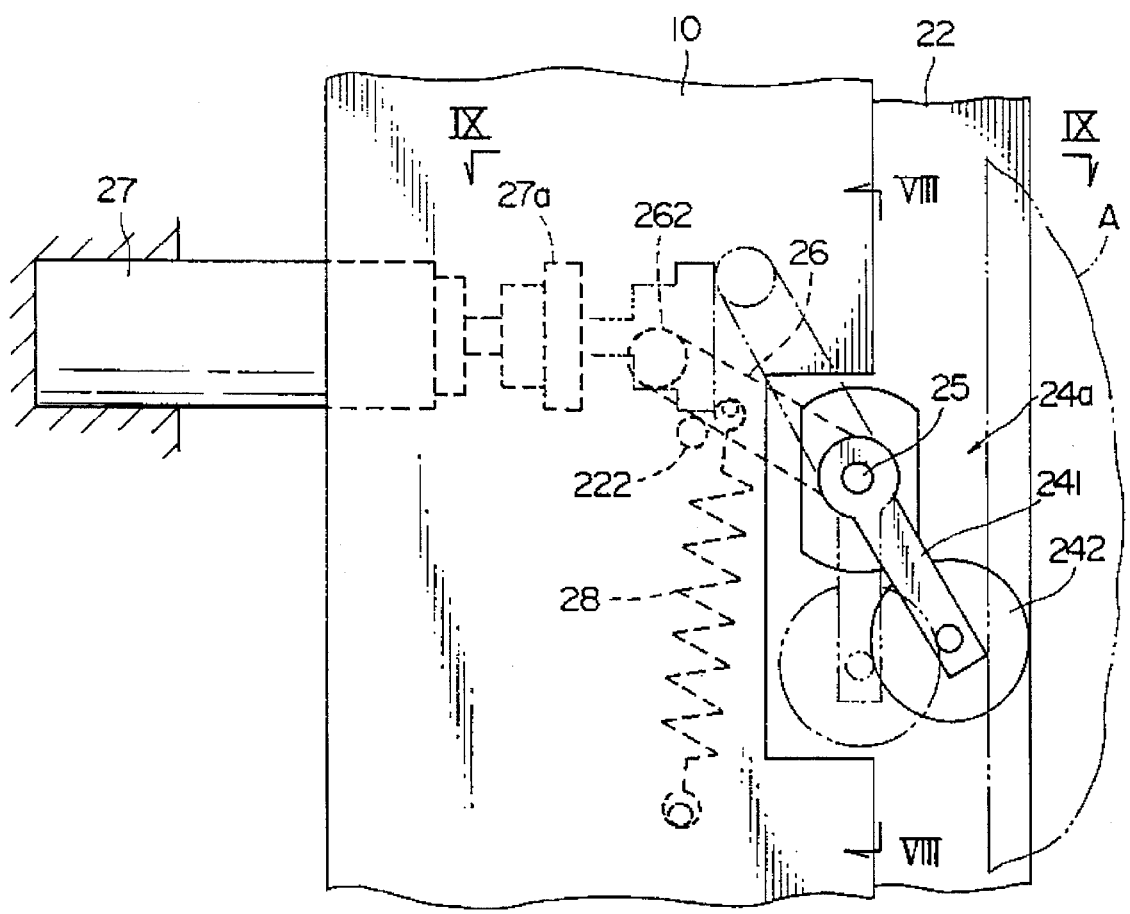
FIG. 7 is an enlarged view of a setting mechanism in FIG. 6.
Figure 8:
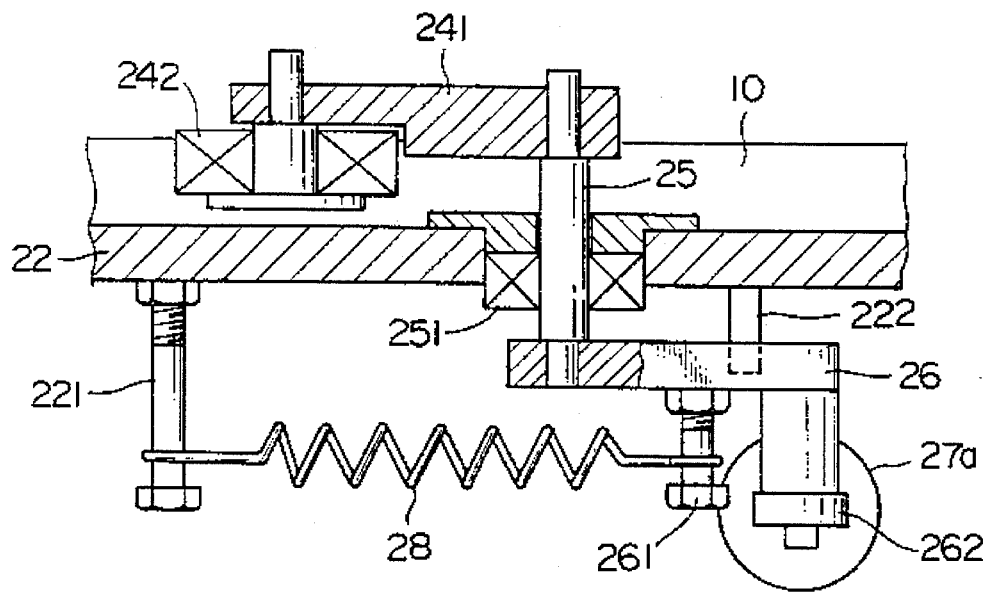
FIG. 8 is a sectional view taken along the line VIII—VIII in FIG. 7.
Figure 9:
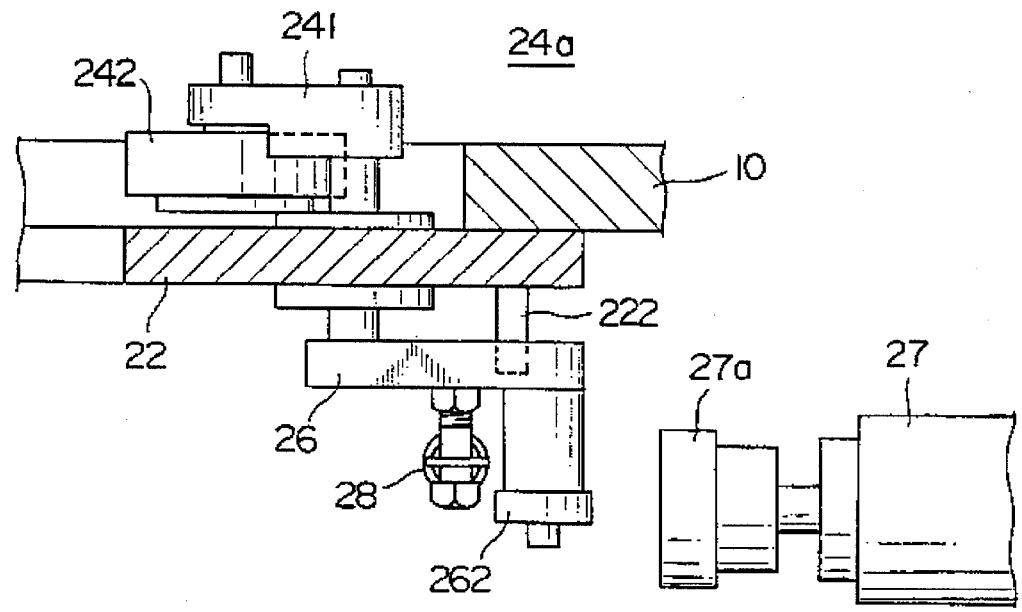
FIG. 9 is a sectional view taken along the line IX—IX in FIG. 7.

As shown in FIGS. 7, 8 and 9, the setting mechanism 24a has a setting roller 242 which is connected with an upper end of vertical axis 25 through swing arms 241. The axis 25 is rotatably supported by the support member 22 through a bearing 251. One end of a lever 26 is fixed to the lower end of the axis 25 and a follower 262 which can be pushed by a forward end of a piston 27a of a releasing cylinder 27 is mounted to the other end of the lever 26. First end of spring 28 is hooked to a pin 261 fixed under the lever 26, while second end of the spring 28 is hooked to a pin 221 fixed under the member 22 so that the setting roller 242 is urged by the spring 28 to be in contact with the plates A and B. A stopper pin 222 for stopping the lever 26 is fixed under the support member 22, so that the piston 27a can come in contact with the follower 262 when the lever is stopped by the pin 222. When the piston 27a of the cylinder 27 is moved outward, the setting roller 242 is separated from side edges of the plates A and B, so that the plates A and B can be freely taken out from the support member 22. Since the setting mechanisms 24b and 24c are similar in structure to the setting mechanism 24a, redundant description on those mechanisms 24b and 24c is omitted.

As to the means for accurately locating the plates A and B on the support member 22, the side stoppers 23a, 23b and 23c and the setting mechanisms 24a, 24b and 24c may be replaced by pin holes $a_3$ and $b_5$ (see FIGS. 2 and 3) of the plates A and B and pins (not shown) projected on the support members 22 to be engaged with the pin holes $a_3$ and $b_5$, or cavities to be engaged with the plates A and B. In these cases, however, since it is necessary to accurately place the plates A and B on the support member 22, working efficiency may be lowered. On the other hand, in the case of utilizing the side stoppers 23a–23c together with the setting mechanisms 24a–24c and the releasing cylinders 27, it is not required to accurately place the plates A and B on the support member 22. As a result, operations of setting and discharging of the plates A and B become easy and a high degree of workability can be attained.

Further, when an actuator such as a cylinder, a solenoid or a motor having a ball screw mechanism is used as the location means, releasing means may become dispensable. However, since fluid tubes or electric wires for supplying hydrostatic pressure or electric current to the actuator should be connected to the movable support member 22 or table 10, the structure thereof may be complicated. On the other hand, the location means formed of setting mechanisms 24a–24c and side stoppers 23a–23c is simple in structure and light in weight.

The pin head 30 is horizontally fixed on the unit body 1 directly below the backing plate 3. As shown in FIG. 10A, the pin head 30 comprises flanged press pins 33 which are uprightly arranged in parallel with each other at pitches corresponding to that of the through holes $a_1$, a pressure receiving plate 31 and a pin plate 32. Flanges 33a of the press pins 33 are prevented from displacement by the pin plate 32, while lower surfaces of the flanges 33a are supported by a horizontal surface 31a of the pressure receiving plate 31. The pin head 30 is further provided with a stripper plate 34 having holes for guiding upper portions of the press pins 33 and guide shafts 35 supporting the stripper plate 34. The guide shafts 35 are slidably inserted in four corner portions of the pressure receiving plate 31, so that lower head portions 35a thereof are inserted in escape bores 36 of the unit body 1 while upper end portions thereof are fixed to the stripper plate 34. springs 37 which are passed through by the guide shafts 35 upwardly urge the stripper plate 34, whose uppermost position is regulated by the head portions 35a of the guide shafts 35. The stripper plate 34 in its uppermost position guides upper ends of the press pins 33.

According to this embodiment, a region of the pin head 30 over which the pins are distributed has a width W which is equivalent to that of a region of the holding plate A over which the holes are distributed, while the former has a length $S_1$ (dimension along the direction of movement of the table 10) which is set to be half a length $S_2$ of the latter (see FIG. 6). In operation, the table 10 is first moved to a set position $P_1$ as shown by a solid line in FIG. 6 so that the holding plate A and the guide plate B are set on the support member 22. Thereafter, the table 10 is moved to a first press position $P_2$, so that the components C in the guide holes $b_1$ distributed at a rear half of the guide plate B are pushed into the holding plate A by the pins 33. Then, the table 10 is further moved to a second press position $P_3$ so that the components C in the guide holes $b_1$ distributed at a front half of the guide plate B are pushed into the holding plate A by the pins 33. Thereafter, the table 10 is further moved to an discharge position $P_4$, so as to take out the holding plate A from the table 10. This discharge position $P_4$ is provided with cylinders 27' for releasing the setting mechanisms 24a, 24b and 24c. After the holding plate A is taken out, the table 10 is again returned to the set position $P_1$.

In place of making the discharge position $P_4$ separately, the set position $P_1$ may also serve as the discharge position $P_4$. In this case, the aforementioned cylinders 27' are not necessary.

When half of the components C are pressed into the holding plate A at one time as hereinabove described, it is possible to reduce a load imposed on the holding plate A in a single press operation, to reduce power for driving the pin head 30, and to miniaturize the press unit. Even if the length $S_2$ of the holding plate A is changed, the same pin head 30 can be used so far as the pitches of the through holes $a_1$ and the width W of the holding plate A are the same. In other words, the pin head 30 has high flexibility with respect to the size of the holding plate A. If it is possible to press the components C toward the holding plate A twice by the press pins 33, the length $S_2$ of the holding plate A may not be an integral number of times as long as the length $S_1$ of the pin head, but is freely changeable.

Figure 10B:
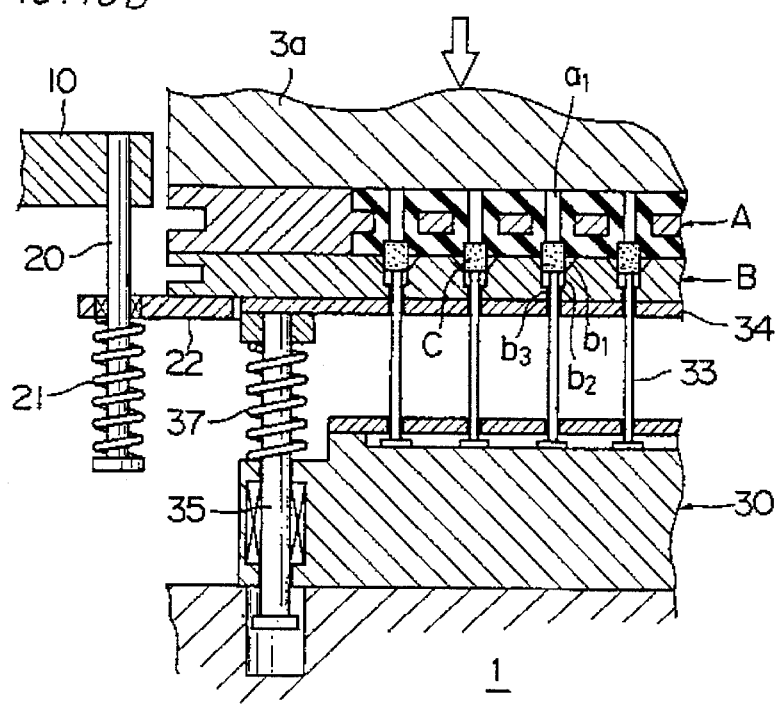
FIG. 10B is a detailed sectional view showing the apparatus when the components are transferred into the holding plate.

An operation for inserting the components C from the guide plate B into the through holes $a_1$ of the holding plate A is now described with reference to FIGS. 10A and 10B.

First, when the table 10 is at the set position $P_1$, the setting mechanisms 24a, 24b and 24c are forced to be opened by the cylinders 27. At this time, the guide plate B in which the components C are already received and the holding plate A without components are superposed on the support member 22. Then, the cylinders 27 cancel their forces so that the setting rollers 242 urged by the springs 28 push the plates A and B toward the stoppers 23a, 23b and 23c, whereby the plates A and B are accurately located at the prescribed position on the support member 22. Thereafter, the table 10 is slid to the first press position $P_2$, so that the press pins 33 are located directly under the guide holes $b_1$ of the guide plate B and the pressing surface 3a of the backing plate 3 is located directly above the holding plate A, as shown in FIG. 10A.

The backing plate 3 is downwardly moved by the cylinder 4, so that the pressing surface 3a of the backing plate 3 presses the upper surface of the holding plate A, whereby the holding plate A together with the guide plate B and the support member 22 are moved downwardly. The springs 21 are compressed following such downward movement of the support member 22. Then, the lower surface of the guide plate B comes into pressure contact with the upper surface of the stripper plate 34, so that the press pins 33 are upwardly projected through the stripper plate 34. The press pins 33 pass through the small diameter portions $b_3$ of the guide plate B to enter the large diameter portions $b_2$, thereby pushing the components C into the through holes $a_1$ of the holding plate A (see FIG. 10B). Since the flanges 33a of the press pins 33 are supported by the horizontal surface 31a of the pressure receiving plate 31, the components C are pushed into the through holes $a_1$ at a certain depth as the backing plate 3 is moved downward. Then, the backing plate 3 stops at the lower limit position when the stoppers 6 come into contact with the stoppers 7 on the unit body 1. In other words, the heights of the stoppers 6 and 7 decide the insertion depth of the components C.

Thereafter, the backing plate 3 is upwardly moved by the cylinder 4, whereby the support member 22, the plates A and B and the stripper plate 34 are integrally moved up by repulsion of the springs 21 and 37. After the press pins 33 are extracted from the guide plate B, the stripper plate 34 is separated from the guide plate B, and then the support member 22 comes into contact with the lower surface of the table 10. Thereafter, the pressing surface 3a is also separated from the holding plate A, to return to the position shown in FIG. 10A.

After the first pressing operation is completed at the first press position $P_2$, the table 10 is moved to the second press position $P_3$, to carry out a second pressing operation similarly to the first pressing operation. Thereafter, the table 10 is moved to the discharge position $P_4$, where only the holding plate A is taken out from the table 10 and carried to a following electrode coating step. Since the components C are held with one end thereof downwardly projected under the holding plate A, it is possible to apply electrode material to the components C without inverting the holding plate A at an angle of 180°. The components C are coated with electrode material on ends thereof by a well-known method, and hence redundant description is omitted. The table 10 supporting the vacated guide plate B is returned to the set position $P_1$, where the guide plate B is taken out from the table 10.

A method of transferring chip components C', which are coated on one ends thereof with electrodes $e_1$, from the holding plate A to another holding plate A' is now described with reference to FIGS. 11A and 11B.

Figure 11A:
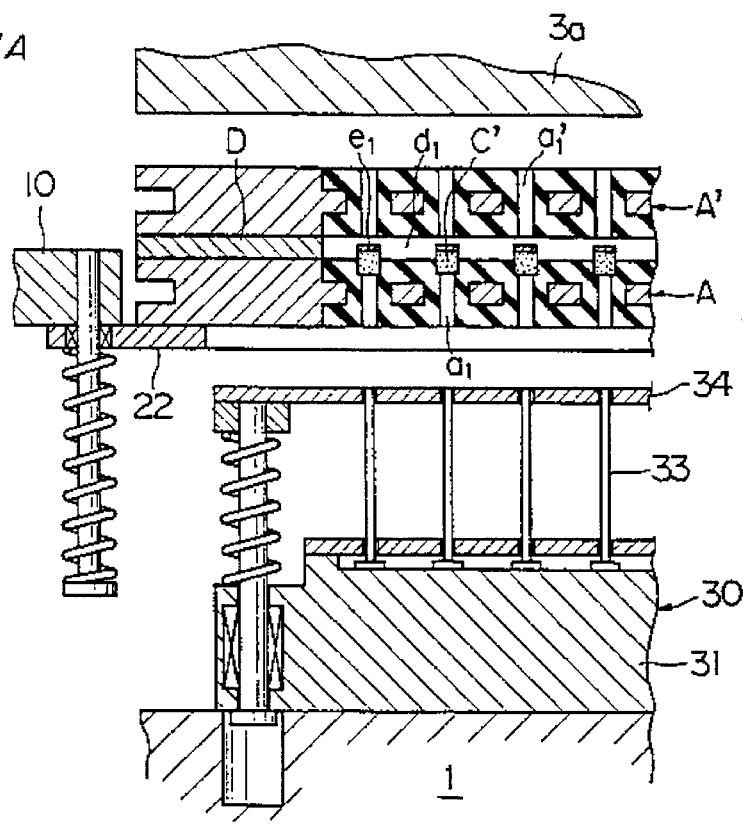
FIG. 11A is a detailed sectional view showing the apparatus before chip components are transferred from a holding plate into another holding plate.

First, the holding plate A upwardly holding the components C' which are coated on upper ends thereof with electrodes $e_1$, a spacer D and another holding plate A' without components are superposed in this order on the support member 22 of the table 10 which is in the set position $P_1$, as shown in FIG. 11A. After the holding plates A and A' and the spacer D are superposed on the support member 22, those jigs A, A' and D are pressed against the side stoppers 23a, 23b and 23c by the setting mechanisms 24a, 24b and 24c, to be located at a constant position. Thereafter, the table 10 is moved to the first press position $P_2$.

Figure 11B:
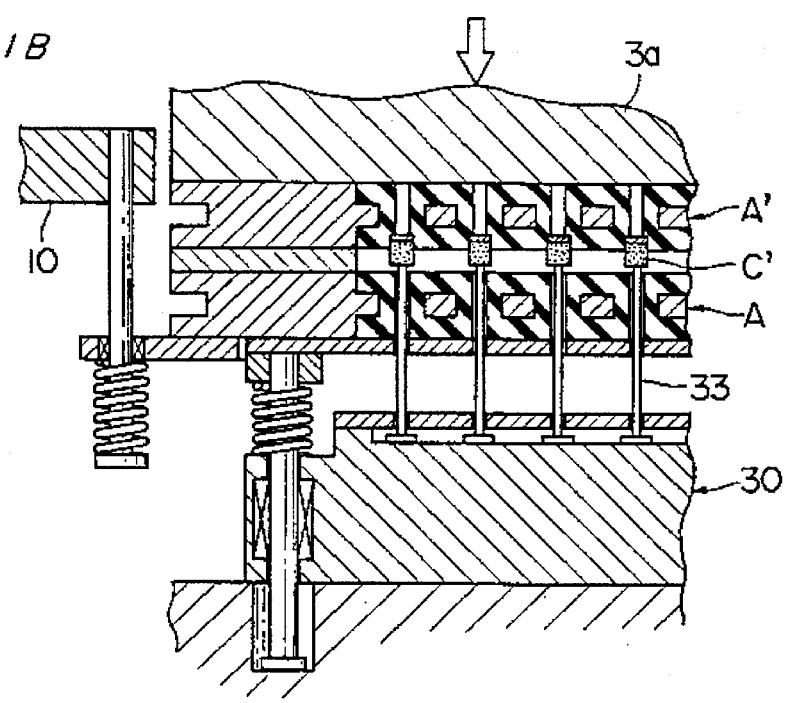
FIG. 11B is a detailed sectional view showing the apparatus when the components are transferred into another holding plate.

At the first press position $P_2$, the components C' are transferred from the through holes $a_1$ of the lower holding plate A to through holes $a_1'$ of the upper holding plate A' by the press pins 33, similarly to the inserting operation (see FIG. 11B). After half of the components C' are transferred to half of the through holes $a_1'$ of the holding plate A', the table 10 is moved to the second press position $P_3$, so that the remaining half of the components C' are transferred to the remaining half of the through holes $a_1'$ by a similar operation.

In this way, the components C' with electrodes on one end are transferred in the aforementioned manner into the holding plate A', which holds the components C' with the other ends downwardly projected therebelow. Then, the holding plate A' is carried to the electrode coating step so that the projected ends are coated with electrode material by a well-known method.

Although the pin head 30 is fixed at a constant position while the backing plate 3 is downwardly moved so as to carry out pressing operations in the aforementioned embodiment, the backing plate 3 may alternatively be fixed at a constant position while the pin head 30 is upwardly moved to carry out pressing operations. In this case, the support member 22 may be rendered vertically movable along upward movement of the pin head 33, so that the upper surface of the holding plate A which is supported by the support member 22 is pressed against the backing plate 3. Thereafter, the components C are upwardly pushed by the press pins 33 to be inserted in the holding plate A.

The structures of the holding plate and the guide plate employed in the present invention are not restricted to those shown in the embodiment. Further, the chip components are not restricted to those of square-pole shapes, but the present invention is also applicable to components having columnar shapes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for pushing chip components from a first plate into a second plate, said first plate and said second plate having a number of through holes corresponding to each other for receiving said chip components, said through holes of said second plate having inner walls to resiliently hold said chip components, said apparatus comprising:

a pin head for upwardly pushing said chip components from said through holes of said first plate into said through holes of said second plate, said pin head having a number of upwardly directed press pins corresponding to said through holes of said first plate and said second plate;

a table arranged above said pin head and being horizontally movable;

a support member for horizontally supporting said first plate and said second plate superposed thereon, said support member including a coupling which vertically movably couples said support member to said table;

location means for locating said first plate and said second plate at a constant position on said support member;

a backing plate for pressing an upper surface of said second plate, said backing plate being arranged above said support member and having a horizontal pressing surface; and drive means for vertically driving said backing plate; wherein said drive means downwardly drives said backing plate so that said pressing surface of said backing plate presses said upper surface of said second plate in order to downwardly move said second plate together with said first plate and said support member, and said press pins upwardly push said chip components from said first plate into said second plate.

2. An apparatus in accordance with claim 1, wherein each of said through holes of said first plate is provided with a large diameter portion opening at an upper surface of said first plate and having a cross-sectional size sufficiently large to receive one of said chip components, and with a small diameter portion extending from a bottom of said large diameter portion to a lower surface of said first plate and having a cross-sectional size which is smaller than a cross-sectional size of each of said chip components and which is large enough to be passed through by one of said press pins.

3. An apparatus in accordance with claim 1, wherein said support member has an opening through which said press pins pass.

4. An apparatus in accordance with claim 1, said apparatus further comprising:

a guide shaft for guiding said support member vertically, said guide shaft being fixed to a lower side of said table; and a spring for upwardly urging said support member to be in contact with said lower side of said table.

5. An apparatus in accordance with claim 4, wherein said table is horizontally movable between a set position and a press position, said first plate and said second plate are placed on said support member at said set position, and said backing plate is arranged above said press position and said pin head is arranged under said press position.

6. An apparatus is accordance with claim 4, wherein said table is horizontally movable among a set position, a press position and a discharge position, said first plate and said second plate are placed on said support member at said set position, said second plate is discharged from said support member at said discharge position, and said backing plate is arranged above said press position and said pin head is arranged under said press position.

7. An apparatus in accordance with claim 1, said apparatus further comprising:

a spacer for defining a clearance between said first plate and said second plate, said spacer being interposed between said first plate and said second plate;

said through holes of said first plate having inner walls to resiliently hold said chip components.

8. An apparatus in accordance with claim 1, wherein said spacer is formed by a plate with a thickness shorter than a length of each of said chip components and has an opening larger than respective regions in which said holes are distributed in said first plate and second plate.

9. An apparatus in accordance with claim 1, wherein said support member has an opening larger than respective regions in which said holes are distributed in said first plate and said second plate.

10. An apparatus in accordance with claim 7, said apparatus further comprising:

a guide shaft for slidably guiding said support member, said guide shaft being vertically fixed to said table; and a spring for upwardly urging said support member to be in contact with a lower surface of said table.

11. An apparatus in accordance with claim 10, wherein said table is horizontally movable between a set position and a press position, said first plate, said spacer and said second plate are placed on said support member at said set position, and said backing plate is arranged above said press position and said pin head is arranged under said press position.

12. An apparatus in accordance with claim 10, wherein said table is horizontally movable among a set position, a press position and a discharge position, said first plate, said spacer and said second plate are placed on said support member at said set position, said second plate is discharged from said support member at said discharge position, and said backing plate is arranged above said press position and said pin head is arranged under said press position.

13. An apparatus in accordance with claim 12, wherein said location means comprises;

side stoppers being fixed on an upper surface of said support member for stopping perpendicular pairs of side edges of said first plate, said spacer and said second plate;

setting means being provided on said support member for pushing said first plate, said spacer and said second plate against said side stoppers; and wherein releasing means for removing pushing force of said setting means are provided beside said set position and said discharge position.

14. An apparatus in accordance with claim 7, wherein said location means has side stoppers being fixed on an upper surface of said support member for stopping perpendicular pairs of side edges of said first plate, said spacer and said second plate, and setting means being provided on said support member for pushing said first plate, said spacer and said second plate against said side stoppers.

15. An apparatus in accordance with claim 14, wherein said setting means comprises:

setting members which keep in touch with remaining pairs of side edges of said first plate, said spacer and said second plate; and urging means which force said setting members to push said first plate, said spacer and said second plate toward said side stoppers.

16. An apparatus in accordance with claim 14, further comprising releasing means for removing pushing force of said setting means.

17. An apparatus in accordance with claim 7, wherein said drive means downwardly drives said backing plate so that said pressing surface of said backing plate presses said upper surface of said second plate in order to downwardly move said second plate together with said spacer, said first plate and said support member, and thereafter said press pins pass through said support member in order to upwardly push said chip components from said first plate into said second plate.

18. An apparatus for pushing chip components from a first plate into a second plate, said first plate and said second plate having a number of through holes corresponding to each other for receiving said chip components, said through holes of said second plate having inner walls to resiliently hold said chip components, said apparatus comprising:

a pin head for upwardly pushing said chip components from said through holes of said first plate into said through holes of said second plate, said pin head having a number of press pins corresponding to said through holes of said first plate and said second plate;

a support member for supporting said first plate and said second plate superposed thereon, said support member being horizontally arranged above said pin head and being vertically movable;

location means for locating said first plate and said second plate at a constant position on said support member;

a backing plate for pressing an upper surface of said second plate, said backing plate being arranged above said support member and having a horizontal pressing surface; and drive means for vertically driving one of said backing plate and said pin head; wherein said location means has side stoppers being fixed on an upper surface of said support member for stopping perpendicular pairs of side edges of said first plate and said second plate, and setting means being provided on said support member for pushing said first plate and said second plate against said side stoppers.

19. An apparatus in accordance with claim 18, wherein said setting means comprises:

setting members which keep in touch with remaining pairs of side edges of said first plate and said second plate; and urging means which force said setting members to push said first plate and said second plate toward said side stoppers.

20. An apparatus in accordance with claim 18, said apparatus further comprising releasing means for removing pushing force of said setting means.

21. An apparatus for pushing chip components from a first plate into a second plate, said first plate and said second plate having a number of through holes corresponding to each other for receiving said chip components, said through holes of said second plate having inner walls to resiliently hold said chip components, said apparatus comprising:

a pin head for upwardly pushing said chip components from said through holes of said first plate into said through holes of said second plate, said pin head having a number of press pins corresponding to said through holes of said first plate and said second plate;

a support member for supporting said first plate and said second plate superposed thereon, said support member being horizontally arranged above said pin head and being vertically movable;

a table, a guide shaft for slidably guiding said support member, said guide shaft being vertically fixed to said table, and a spring for upwardly urging said support member to be in contact with a lower surface of said table;

said table being horizontally movable among a set position, a press position and a discharge position, such that said first plate and said second plate can be placed on said support member at said set position, said second plate can be discharged from said support member at said discharge position;

location means for locating said first plate and said second plate at a constant position on said support member;

a backing plate for pressing an upper surface of said second plate, said backing plate being arranged above said support member and having a horizontal pressing surface;

said backing plate being arranged above said press position and said pin head being arranged under said press position; and drive means for vertically driving one of said backing plate and said pin head;

wherein said location means comprises:

side stoppers being fixed on an upper surface of said support member for stopping perpendicular pairs of edges of said first plate and said second plate;

setting means being provided on said support member for pushing said first plate and said second plate against said side stoppers; and releasing means for removing a pushing force of said setting means beside said set position and said discharge position.

* * * * *